June 12, 1962 H. J. GRAY, JR., ET AL 3,039,009

TRANSISTOR AMPLIFIERS FOR PULSE SIGNALS

Filed Jan. 27, 1958 2 Sheets-Sheet 1

*INVENTORS*
HARRY J. GRAY
JOHN G. NORDAHL
Horton C. Jacobs
ATTORNEY

June 12, 1962 H. J. GRAY, JR., ET AL 3,039,009

TRANSISTOR AMPLIFIERS FOR PULSE SIGNALS

Filed Jan. 27, 1958 2 Sheets-Sheet 2

INVENTORS
HARRY J. GRAY
JOHN G. NORDAHL

ATTORNEY

United States Patent Office 3,039,009
Patented June 12, 1962

3,039,009

TRANSISTOR AMPLIFIERS FOR PULSE SIGNALS

Harry J. Gray, Jr., Media, and John G. Nordahl, Elkins Park, Pa., assignors to Sperry Rand Corporation, New York, N.Y., a corporation of Delaware Filed Jan. 27, 1958, Ser. No. 711,224
4 Claims. (Cl. 307—88.5)

This invention relates to electronic amplifiers, and particularly to transistor amplifiers for pulse signals.

A related transistor pulse amplifier is described in a copending patent application of Nordahl et al., Serial No. 673,224, filed July 22, 1957, now Patent No. 2,949,543.

It is among the objects of this invention to provide:

A new and improved transistor pulse amplifier having high gain;

A new and improved transistor pulse amplifier that is fast in operation.

In accordance with this invention the collector-emitter path of a first transistor is connected to the base of a second transistor. Input signals are applied to the base of the first transistor, and output signals are derived from the collector-emitter path of the second transistor. An inductor is also connected to the second transistor base.

During conduction of the transistors, a portion of collector-emitter current of the first transistor tends to flow through the inductor. When the first transistor is cut off, the inductor current tends to continue and applies a reverse bias to the base-emitter path of the second transistor to accelerate its turn-off.

The foregoing and other objects, the advantages and novel features of this invention, as well as the invention itself both as to its organization and mode of operation, may be best understood from the following description when read in connection with the accompanying drawing, in which like reference numerals refer to like parts, and in which.

Figure 1:
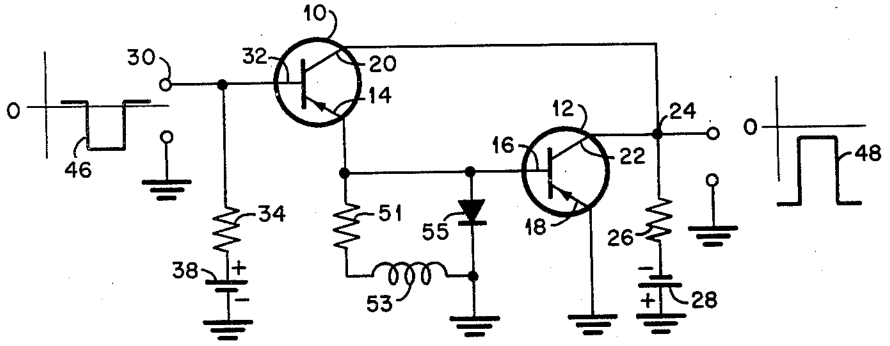
FIGURE 1 is a schematic circuit diagram of a transistor pulse amplifier embodying this invention.

In FIGURE 1, a transistor pulse amplifier circuit embodying this invention includes a first transistor 10 and a second transistor 12. These transistors may be of the junction type, and are shown in FIGURE 1 by way of illustration to be p-n-p type. The emitter 14 of the first transistor 10 is connected to the base 16 of the second transistor 12. The second transistor 12 is connected as a common emitter circuit with its emitter 18 connected to a common return path shown by the conventional ground symbol. The collectors 20 and 22 of the respective transistors 10 and 12 are both connected to an output terminal 24, which terminal 24 is connected through a load resistor 26 to the negative terminal of a direct voltage source 28. The positive terminal of the source 28 is returned to ground. A terminal 30 connected to the base 32 of the first transistor 10 receives input signals 46 from a source (not shown). The base 32 may be biased by way of a resistor 34 and a direct voltage source 38. The source 38 (together with the quiescent voltage supplied to the input terminal 30) biases the emitter-base paths of the transistors 10 and 12 in the reverse direction.

Figure 2:
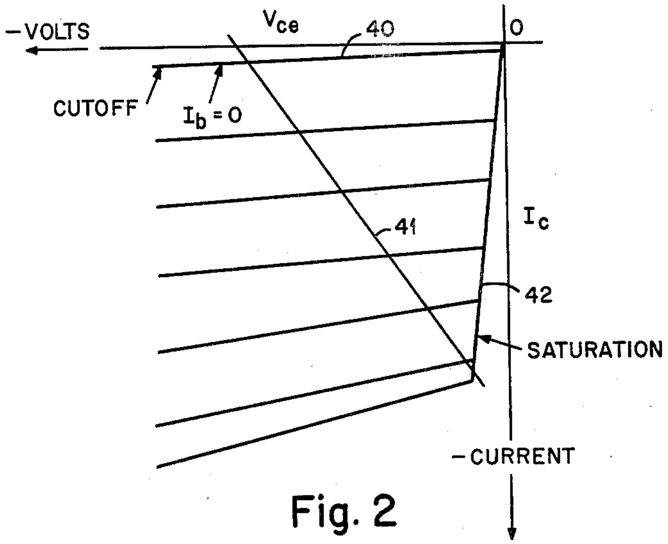
FIGURE 2 is an idealized graph of the collector characteristics of transistors that may be used in the circuit of FIGURE 1.

An idealized graph of suitable collector characteristics for the transistors 10, 12 is shown in FIGURE 2. A linear or active region of operation of the circuit of FIGURE 1 lies generally between the cut off region 40 and the saturation region 42. The cut off region 40 is characterized by zero (or reverse) base current. The saturation region 42 is characterized by a maximum collector current for the particular circuit parameters. It may be assumed that the transistors follow the load line 41 when operating in the linear region with a suitable resistive load.

In operation of the circuit described thus far, the emitter current of the first transistor 10 (which current is made up of the emitter-base current plus the emitter-collector current) is supplied from the base 16 of the second transistor 12. The emitter current of the first transistor 10 flows in the emitter-base path of the second transistor 12. The emitter current of each transistor generally varies in the same direction with the respective base current. Therefore, the emitter current of the second transistor also varies in the same direction with the input signal.

The collector current of the first transistor 10 is proportional to the product of the common-emitter current-gain factor of that transistor and the base current, $B_1I_b$, where $B_1$ is the beta current gain of the first transistor 10 and $I_b$ is the base current of this transistor. The base current of the second transistor 12 (which is the sum of the base and collector currents of the first transistor 10) is proportional to $B_1I_b+I_b$. The collector current of the second transistor 12, therefore, is $B_1B_2I_b+B_2I_b$, where $B_2$ is the common-emitter, or beta, current-gain factor of the second transistor 12. Thus, the sum of the currents through both collectors 20 and 22 supplied to the output terminal 24 and the load resistor 26 is $B_1I_b+B_1B_2I_b+B_2I_b$. Accordingly, during operation of this circuit in the linear region, the combined collector current gain is generally the sum of the individual gains of these transistors 10 and 12 plus the product of the individual gains.

In the quiescent condition, both transistors 10 and 12 have substantially zero base current (represented by the line 40 of the graph of FIGURE 2), and both transistors are cut off. A negative-going pulse 46 at the input terminal 30 draws base-emitter current in the forward direction through the transistor 10 and similarly through the transistor 12. Consequently, both transistors 10 and 12 immediately start to conduct; the amplified emitter current of the first transistor 10 tends to produce a fast response in the second transistor 12. The amplitude of the input pulse 46 may be such that the first transistor 10 is driven into saturation (line 42 of FIGURE 2).

Upon termination of the input pulse 46 the base 32 is again biased in a reversed direction, which reverse bias terminates emitter-base current and cuts off both transistors 10 and 12. An output voltage pulse 48 at the output terminal 24 is positive-going. Thus the circuit operates to invert the input signal. Upon termination of the input pulse 46 the circuit is restored to the quiescent condition.

Notwithstanding saturation of the first transistor 10 and the gain of that transistor 10, the second transistor 12 does not saturate no matter how hard the base 16 may be driven by emitter current from the first transistor 10. The second transistor 12 remains out of saturation because there is a small emitter to collector voltage drop (of the order of a fraction of a volt) in the first transistor 10 due to collector-emitter current and the very small resistance of the collector-emitter path in saturation. This small voltage drop makes the emitter 14 slightly positive with respect to the collector 20 and, thereby, makes the base 16 of the second transistor 12 slightly positive with respect to its collector 22. Thus, the collector-base junction of the second transistor 12 remains biased in the reversed direction, which condition is necessary and sufficient to insure that the second transistor 12 remains out of saturation. Thus, when the second transistor is rendered conductive in the manner just described, it operates in a region close to the saturation region 42 (FIGURE 2) of the transfer characteristic (where the collector voltage is relatively small), but, nevertheless, the transistor 12 operates out of saturation. Consequently, the base-collector junction of the second transistor 12 remains biased in the reversed direction, which condition is necessary and sufficient to insure that the second transistor 12 remains out of saturation. Thus, when the second transistor is rendered conductive in the manner just described, it operates in a region close to the saturation region 42 (FIGURE 2) of the transfer characteristic (where the collector voltage is relatively small), but, nevertheless, the transistor 12 operates out of saturation.

Due to the small collector voltage with the transistor near saturation, there is relatively small collector power dissipation notwithstanding a very large collector current. Consequently, the second transistor 12 may be operated at a high current level both efficiently and safely. The operation of the second transistor 12 just out of saturation provides two distinct voltage levels at the output terminal 24; namely, (1) substantially the voltage of the source 28 (corresponding to both transistors 10 and 12 being at cut off) and (2) (corresponding to both transistors being at full conduction) substantially the difference between the potential of the emitter 18 (ground potential in FIGURE 1) and the voltage drop from the emitter 18 to the collector 22. Thus, this circuit is suitable for use in different applications involving pulse signals, and particularly in applications, such as in digital information handling systems, requiring two rather precise signal levels.

The operation of the second transistor 12 in an out-of-saturation condition affects favorably the speed of response of the pulse amplifier circuit of FIGURE 1. The "turn-off" time of a transistor from the saturation state to the cut off state consists of, first, the minority carrier storage time for a change from the saturation region 42 (FIGURE 2) into the linear region upon termination of the drive current and, second, the decay time for returning the transistor to the cut off state from operation in the linear region. Thus, with the second transistor 12 operating just out of saturation, there is no turn-off time delay due to minority carrier storage in that transistor 12. There is only the decay time to cut off. The turn-off of the first transistor 10 from saturation to the linear region and then to cut off is accelerated by the trailing edge of the input pulse 46. At this trailing edge, the bias voltage 38 is effective to produce a reverse base-emitter current, which sweeps out stored minority carriers and tends to accelerate the decay of the transistor 10 to the cut off region 40 (FIGURE 2). Consequently, the pulse amplifier circuit of FIGURE 1 may be used to provide a very high gain without the excessive turn-off time delays generally associated with such high gain.

The advantages of high gain and fast response of the pulse amplifier circuit of FIGURE 2 may be furthered by using different types of transistors for the two transistors 10 and 12. The second transistor 12 may be a high current level transistor (that is, a transistor that can safely dissipate a relatively large amount of power) and the first transistor 10 may be a low current level transistor (relatively low power dissipation). It has been found that certain low current level transistors generally are associated with a high alpha cut off frequency and generally have a relatively small minority carrier storage time. The large minority carrier storage time generally associated with the high current level transistors does not affect adversely the operation of this circuit, because the second transistor 12 is operated out of saturation. Thus, the operation of the second transistor 12 at a higher current level than the first transistor 10 (which higher current is a result of the cascaded mode of operation) does not add minority carrier storage time to the circuit delay times.

In accordance with this invention, the circuit of FIGURE 1 includes a novel arrangement for accelerating the turn-off of the second transistor 12. A series combination of a resistor 51 and an inductor 53 are connected between the base 16 and a reference potential terminal shown as ground. A diode 55 is also connected between the base 16 and ground and poled to clamp the junction of the base 16 and the emitter 14 at near ground potential.

In operation, the resistance-inductance combination 51, 53 presents a high impedance to sudden changes in current. Thus, during the initial part of the turn-on of the first transistor 10, there is very little current in the combination 51, 53; substantially all of the emitter current of the first transistor 10 flows in the base-emitter path of the second transistor 12. Accordingly, in this initial period, the combination 51, 53 does not impair the speed of turn-on of the transistor 12. Gradually, however, the current through the inductor 53 increases, and, after a relatively long period determined by the inductance-resistance time constant, this current reaches a steady-state value. This steady-state current is equal to the base voltage (the base-emitter voltage drop) during conduction of the second transistor 12 divided by the resistance of the resistor 51.

When the first transistor 10 is driven to cutoff, the steady-state current (if the inductance-resistance time constant is such that a steady state is reached) in the combination 51, 53 tends to continue. This continuing current flows into the base 16 to bias the second transistor 12 in the reverse direction. This reverse base current accelerates the cutoff of the second transistor 12. When this transistor 12 is cutoff, the diode 55 feeds to ground any current continuing through the inductor 53. Thereby, any such continuing current does not flow into the emitter 14 and turn on the first transistor 10. The resistor 51-inductor 53 combination can be designed to permit, without adverse effect, such continuing inductor current after transistor cutoff and thus accommodate a wide range of transistor characteristics. As long as emitter-base current flows in the second transistor 12, the diode 55 is biased in the back direction. Forward current through the diode 55 results in the cutoff emitter voltage of the first transistor 10 being above ground potential. The positive bias voltage supplied by the source 38 for the base 32 during cutoff is such as to prevent turn-on of the first transistor 10 by any excess current through the inductor 53.

The value of this current through the resistor 51-inductor 53 combination at any given time depends upon the parameters of the voltage drop across the emitter-base path of the second transistor, the voltage level to which the inductor 53 is connected, and the values of the resistor 51 and the inductor 53. These parameters are chosen from the standpoints of the effects of this current during turn-on, full conduction, and turn-off of the transistors 10 and 12. A larger peak current is provided where high turn-off speed is more important, and a smaller current where high turn-on speed is more important. For example, the peak current may be increased by connecting the inductor to a positive voltage level instead of to ground; the diode generally would be returned to substantially the same voltage as that of the emitter 18. The resulting increase in turn-off speed would involve some decrease in turn-on speed and in overall gain. An optimum current valve may be chosen where turn-on and turn-off times are to be the same. Generally, the resistance-inductance time constant is chosen with a view to both the expected minimum pulse duration (or on time) and minimum time between pulses (or off time).

Generally, this time constant should be such that ample turn-off current is built up during a pulse, and this turn-off current decays completely between pulses.

Figure 3:
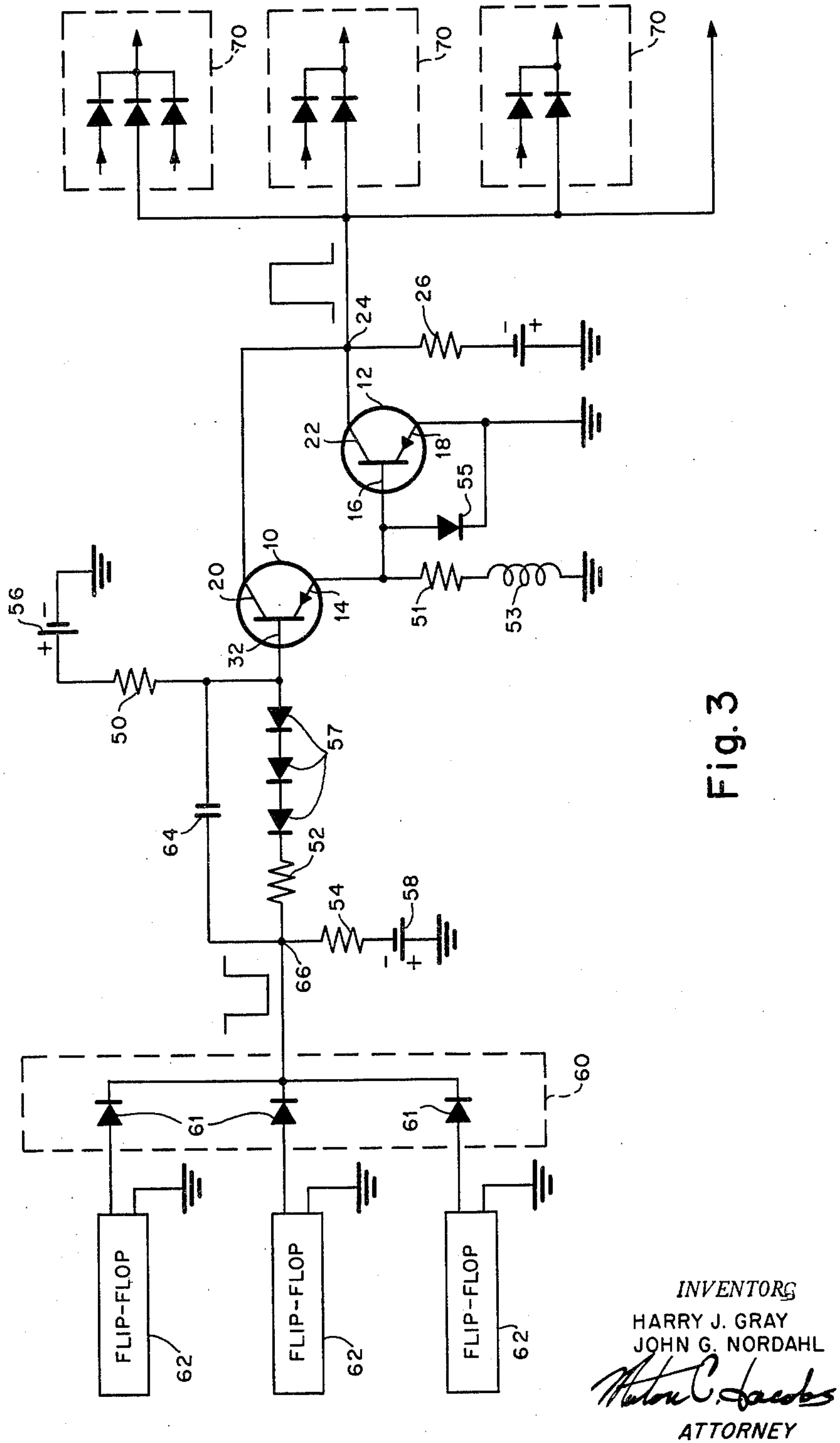
FIGURE 3 is a schematic circuit diagram of a pulse system incorporating a transistor pulse amplifier embodying this invention.

In FIGURE 3, a pulse amplifier circuit similar to that described above is shown in an application involving binary digital circuits. Parts corresponding to those previously described are referenced by the same numerals. The base-emitter path of the first transistor 10 tends to be biased in the forward direction by means of the series combination of resistors 50, 52, 54, forward biased diodes 57, and the direct voltage sources 56 and 58 in the absence of input current to the terminal 66. Each of the plurality of diodes provides a fraction-of-a-volt bias voltage, and a plurality may be used, as shown, where the design requires the combined voltage drop. A diode logic circuit 60 such as an "and" gate or buffer, supplies input current to the terminal 66 to produce a reverse bias of the base-emitter path of the first transistor 10. The diodes 61 of the logic circuit 60 are respectively driven by individual binary digital elements (one form of which may be, for example, the flip-flop 62) in a suitable fashion. The binary signals supplied by the flip-flops 62 either cause the associated diodes 61 to conduct in the forward direction or bias the diodes 61 in the back direction. A capacitor 64 is connected across the series combination of resistor 52 and diodes 57 to produce a differentiating action of any step of voltage appearing at the terminal 66. The resistor 26 serves as a discharge path for stray capacitances and as a nominal load. The output terminal 24 of the pulse amplifier is connected to the diodes of a number of logic circuits 70. This pulse amplifier may be used to drive a large number of these logic circuits 70 only a few of which are shown by way of illustration. The circuits 70, in turn, may be connected to other binary circuits, such as other logic circuits (not shown). A set of suitable circuit parameters and transistor types are indicated in FIGURE 3 to illustrate an operative embodiment of this invention.

In operation, the combination of initial conditions of the flip-flops 62 produce (for the illustrated circuit parameters) one or more signals in the most positive state, each at about ground potential, at the anodes of any of the diodes 61. These diodes 61 conduct to produce (together with the total voltage drop across the diodes 57) a reverse bias on the base 32 of the first transistor 10. This reverse bias maintains both transistors 10 and 12 in the cutoff condition. An abrupt drop of voltage from all the flip-flops 62 of a few volts results in a similarly abrupt negative-going step of voltage at the terminal 66, since the conducting diodes 57 resemble a series battery. This nagative-going voltage step is differentiated by the capacitor 64 and applied to the base 32 to draw emitter-base current in the forward direction. Both transistors 10 and 12 start to conduct, and the first transistor 10 quickly saturates as the voltage at the collector 20 rises to a voltage slightly negative with respect to its emitter 14. The second transistor 12 conducts heavily but is held just out of saturation in a manner similar to that described above. The direct current connection via the resistor 52 which allows sustained current to flow between the terminal 66 and the base 32 maintains the amplifier, in the conducting condition as long as the terminal 66 is held in the most negative state. The corresponding positive-going step appearing at the output terminal 24 drives the diodes of the logic circuit 70 connected to that terminal 24.

When the flip-flop 62 reverse their conditions to apply a positive-going voltage step to the anodes of the diodes 61, the resulting positive-going step of voltage at the terminal 66 is differentiated by the capacitor 64 and applied to the base 32 to drive the transistor 10 in the reverse direction. Reverse current forced into the base 32 in this manner quickly "clean up" the minority carrier of the heavily saturated first transistor 10. Thus this transistor 10 is rapidly driven out of saturation and to cutoff as its junction currents fall to zero.

The second transistor 12 is turned off quickly by the resistor 51-inductor 53 combination in a manner similar to that described above. The high impedance of the inductor 53 during turn-on of the transistor 12 ensures a fast turn-on as well as a fast turn-off characteristic.

Accordingly, by means of this invention, a new and improved transistor amplifier is provided. This amplifier has high gain. This amplifier may be used for pulse signals and has fast turn-off and turn-on response characteristics.

What is claimed is:

1. An amplifier comprising a plurality of semi-conductor devices each having base, emitter, and collector electrodes; means connecting the emitter electrode of a first one of said semi-conductor devices to the base electrode of a second one of said semi-conductor devices whereby substantially all of the base-emitter and collector-emitter currents of said first semi-conductor device flow in the base-emitter path of said second semi-conductor device for an initial period; means for supplying input signals to the base electrode of said first semi-conductor device; means for connecting a reference potential to the emitter electrode of said second semi-conductor device and to said means for supplying input signals; output means connected for receiving current flow in the collector-emitter path of said second semi-conductor device; circuitry means connected to the emitter electrode of said first semi-conductor device and for connection to said reference potential for supplying part of said base-emitter and collector-emitter current of said first semi-conductor device after said initial period, said circuitry means further connected to the base electrode of said second semi-conductor device for biasing said second semi-conductor device in the reverse direction when emitter current of said first semi-conductive device is cut-off; and said circuitry means including a series-connected inductor and resistor combination connected to said base element of said second semi-conductor device and having means for connection to said reference potential and a diode connected across said series-connected combination and poled oppositely from said second semi-conductor device.

2. An amplifier comprising a first transistor and a second transistor, each of said transistors having emitter, base and collector electrodes, potential biasing means of one polarity and input signal means coupled to said base electrode of said first transistor, potential biasing means of the opposite polarity and an output signal terminal coupled to the collectors of both of said transistors, a cut-off acceleration network comprising a relatively low bi-directional impedance leg and a relatively high uni-directional impedance leg, said network coupled at one of its ends between said emitter and said base of said first and said second transistor, respectively, and to ground at its other end, and conductor means coupling said emitter of said second transistor to ground.

3. The combination as defined in claim 2 wherein said transistors are junction transistors and of similar conductivity types.

4. An amplifier comprising a first transistor and a second transistor, each of said transistors having emitter, base and collector electrodes, potential biasing means of one polarity and input signal means coupled to said base electrode of said first transistor, potential biasing means of the opposite polarity and an output signal terminal coupled to the collectors of both of said transistors, and a cut-off acceleration network coupled at one of its ends to the emitter and base of said first and said second transistors, respectively, said network comprising a series connected resistor and inductor and a diode coupled across said series connection and in parallel fashion, said diode poled so as to pass current to ground.

(References on following page)

References Cited in the file of this patent

UNITED STATES PATENTS

| | | |
|---|---|---|
| 2,594,336 | Mohr | Apr. 29, 1952 |
| 2,843,761 | Carlson | July 15, 1958 |
| 2,856,528 | Brewster | Oct. 14, 1958 |
| 2,897,378 | Jones | July 28, 1959 |
| 2,915,649 | Cagle | Dec. 1, 1959 |
| 2,949,543 | Nordahl | Aug. 16, 1960 |

OTHER REFERENCES

Article entitled "The Transistor Regenerative Amplifier as a Computer Element," by Chaplin, Proc. of Inst. of Elec. Engr., vol. 101, part III, No. 73, October 1954, pages 298–307.

Article entitled "Junction Transistor Circuit Applications," by Sulzer, Electronics, August 1953, pp. 170–173.